(12) United States Patent
Ramirez

(10) Patent No.: US 10,578,510 B2
(45) Date of Patent: Mar. 3, 2020

(54) DEVICE FOR DESORBING MOLECULES FROM CHAMBER WALLS

(71) Applicant: APPLIED MATERIALS, INC., Santa Clara, CA (US)

(72) Inventor: Ricardo M. Ramirez, Bastrop, TX (US)

(73) Assignee: Applied Materials, Inc., Santa Clara, CA (US)

(*) Notice: Subject to any disclaimer, the term of this patent is extended or adjusted under 35 U.S.C. 154(b) by 80 days.

(21) Appl. No.: 15/362,710

(22) Filed: Nov. 28, 2016

(65) Prior Publication Data

US 2018/0149547 A1  May 31, 2018

(51) Int. Cl.
*H01L 21/67* (2006.01)
*G01M 3/02* (2006.01)
*G01M 3/20* (2006.01)

(52) U.S. Cl.
CPC .............. *G01M 3/02* (2013.01); *G01M 3/202* (2013.01); *H01L 21/67028* (2013.01); *H01L 21/67115* (2013.01); *H01L 21/67201* (2013.01); *H01L 21/67288* (2013.01)

(58) Field of Classification Search
CPC ................. A61L 2/10; H01L 21/67201; H01L 21/67115; H01L 21/67028; H01L 21/67288
See application file for complete search history.

(56) References Cited

U.S. PATENT DOCUMENTS

| 5,611,089 | A | * | 3/1997 | Cretors | A47K 13/24 |
| | | | | | 4/234 |
| 6,656,424 | B1 | * | 12/2003 | Deal | A61L 2/10 |
| | | | | | 250/455.11 |
| 6,673,278 | B1 | * | 1/2004 | Buazza | B29C 35/08 |
| | | | | | 264/1.38 |
| 6,683,421 | B1 | * | 1/2004 | Kennedy | B29C 35/0288 |
| | | | | | 315/149 |
| 7,086,756 | B2 | * | 8/2006 | Maxik | F21K 9/90 |
| | | | | | 362/249.04 |
| 7,135,034 | B2 | * | 11/2006 | Friedman | A61M 25/1011 |
| | | | | | 607/88 |

(Continued)

FOREIGN PATENT DOCUMENTS

WO    WO 95/03622    2/1995

OTHER PUBLICATIONS

Nobuyuki Mise et al., "A Novel Wireless on-Wafer Plasma Sensor using Light-Emitting Diodes", pp. 174-177, 2003, IEEE.

*Primary Examiner* — Nicole M Ippolito
*Assistant Examiner* — Sean M Luck
(74) *Attorney, Agent, or Firm* — Schwabe, Williamson & Wyatt, P.C.

(57) ABSTRACT

Embodiments include devices and methods for desorbing molecules from a chamber wall. In an embodiment, a desorption device includes several light emitting diodes (LEDs) mounted on a substrate having a wafer form factor. The LEDs may emit ultraviolet (UV) radiation, such as UV radiation in a UV C range. In an embodiment, the LEDs are thermally coupled to a heat exchanger, such as a thermo-electric cooling device. The emitted radiation may uniformly irradiate a chamber wall to desorb water molecules from the chamber wall. Other embodiments are also described and claimed.

18 Claims, 6 Drawing Sheets

(56) References Cited

U.S. PATENT DOCUMENTS

| | | | | |
|---|---|---|---|---|
| 7,434,964 B1* | 10/2008 | Zheng | F21V 29/777 | 362/294 |
| 7,498,065 B2* | 3/2009 | Siegel | B05D 3/067 | 250/491.1 |
| 7,568,817 B2* | 8/2009 | Lee | F21K 9/00 | 362/294 |
| 8,123,389 B2* | 2/2012 | Hitchcock | F21V 25/10 | 362/580 |
| 8,251,689 B2* | 8/2012 | Custer | B41J 11/002 | 204/471 |
| 8,540,408 B2* | 9/2013 | Takahashi | F21V 23/006 | 362/217.1 |
| 8,823,933 B2 | 9/2014 | Bonciolini et al. | | |
| 9,063,050 B2* | 6/2015 | Suga | G01N 17/004 | |
| 9,068,701 B2* | 6/2015 | Progl | F21K 99/00 | |
| 9,217,544 B2* | 12/2015 | Tong | F21K 9/00 | |
| 2001/0046652 A1* | 11/2001 | Ostler | A61C 19/004 | 433/29 |
| 2004/0070990 A1* | 4/2004 | Szypszak | G01N 21/8806 | 362/555 |
| 2004/0164325 A1* | 8/2004 | Siegel | B41F 23/0409 | 257/200 |
| 2004/0166249 A1* | 8/2004 | Siegel | B41F 23/0409 | 427/558 |
| 2005/0042390 A1* | 2/2005 | Siegel | B41F 23/0409 | 427/585 |
| 2005/0087768 A1* | 4/2005 | March | G01N 17/004 | 257/200 |
| 2005/0231983 A1* | 10/2005 | Dahm | A61C 19/003 | 362/294 |
| 2005/0280683 A1* | 12/2005 | Custer | B41J 11/002 | 347/102 |
| 2006/0061487 A1* | 3/2006 | Heap | G09F 13/22 | 340/908 |
| 2006/0167532 A1* | 7/2006 | Parker | A61N 5/0616 | 607/88 |
| 2006/0206997 A1* | 9/2006 | Chiang | A47K 13/302 | 4/233 |
| 2007/0187612 A1* | 8/2007 | Inoue | B29C 65/1406 | 250/372 |
| 2008/0205062 A1* | 8/2008 | Dahm | F21K 9/00 | 362/294 |
| 2008/0265179 A1* | 10/2008 | Havens | A61L 2/10 | 250/492.1 |
| 2008/0308748 A1* | 12/2008 | Burrows | A43B 1/0036 | 250/491.1 |
| 2008/0315132 A1* | 12/2008 | Platsch | F26B 3/283 | 250/504 R |
| 2009/0237934 A1* | 9/2009 | Zeng | F21V 21/30 | 362/249.03 |
| 2010/0207502 A1* | 8/2010 | Cao | F21V 3/00 | 313/46 |
| 2011/0030241 A1* | 2/2011 | Reuben | A43B 1/0045 | 36/43 |
| 2011/0243789 A1* | 10/2011 | Roberts | A61L 2/10 | 422/24 |
| 2011/0290991 A1* | 12/2011 | Booth | C23C 14/221 | 250/251 |
| 2012/0165716 A1* | 6/2012 | Reuben | A61F 13/0203 | 602/56 |
| 2012/0176804 A1* | 7/2012 | Bohler | B82Y 10/00 | 362/373 |
| 2012/0188771 A1* | 7/2012 | Kraus | F21V 3/02 | 362/294 |
| 2013/0020462 A1* | 1/2013 | Kim | F21V 19/003 | 250/205 |
| 2013/0035629 A1* | 2/2013 | Soltz | A61M 35/00 | 604/20 |
| 2013/0044501 A1* | 2/2013 | Rudisill | F21V 29/004 | 362/398 |
| 2013/0201683 A1* | 8/2013 | Kirchberger | F21S 6/003 | 362/235 |
| 2014/0131595 A1* | 5/2014 | Nathan | A61L 2/0047 | 250/504 R |
| 2014/0161663 A1* | 6/2014 | Farren | A61L 2/10 | 422/24 |
| 2014/0259634 A1* | 9/2014 | Cox | G09F 27/008 | 29/592.1 |
| 2014/0265039 A1* | 9/2014 | Bellec | A61L 2/085 | 264/405 |
| 2014/0340899 A1* | 11/2014 | Bailey | F21V 23/006 | 362/245 |
| 2015/0102235 A1* | 4/2015 | Lee | A61L 2/10 | 250/492.1 |
| 2015/0196674 A1* | 7/2015 | Newham | A61L 2/10 | 250/455.11 |
| 2015/0226389 A1* | 8/2015 | Kasugai | G02B 26/008 | 353/31 |

* cited by examiner

DEVICE FOR DESORBING MOLECULES FROM CHAMBER WALLS

BACKGROUND

1) Field

Embodiments relate to the field of semiconductor processing and, in particular, to devices and methods for detecting leaks in a wafer processing tool.

2) Description of Related Art

Leak testing is performed on vacuum chambers of wafer processing equipment, e.g., at different points during assembly of the wafer processing equipment, to verify that a level of vacuum can be achieved without leaks. In some cases, a leak detector, which can be a self-contained mass spectrometer tuned to the mass of helium, is used to scan for the presence of helium within a vacuum chamber. The helium leak rate can indicate that the vacuum chamber requires repair.

SUMMARY

Embodiments include a device for desorbing molecules from a chamber wall. The desorption device includes a substrate having a wafer form factor, e.g., having a diameter in a range of 95-455 mm. The substrate includes a support surface, and several light emitting diodes (LEDs) are mounted on the support surface. The LEDs emit ultraviolet (UV) radiation when electrically powered. For example, the LEDs may emit UV radiation in a UV C range. The desorption device may include a power source mounted on the substrate, and the power source may be electrically coupled to the LEDs to electrically power the LEDs.

The LEDs may be arranged to uniformly irradiate interior chamber walls of a process chamber. For example, the LEDs may include a first set of LEDs mounted symmetrically about a central axis extending orthogonal to a top surface of the substrate to irradiate an upper region of the chamber walls. The LEDs may include a second set of LEDs mounted on a bottom surface of the substrate to irradiate a lower region of the chamber walls. The LEDs may include a third set of LEDs mounted on a lateral edge of the substrate to irradiate a region of the chamber walls between the upper region and the lower region. In an embodiment, one or more of the top surface or the bottom surface is a curved surface to direct the UV radiation at an angle to the central axis, and to uniformly distribute the radiation on the chamber walls.

In an embodiment, a heat exchanger is thermally coupled to at least one of the LEDs to transfer heat away from the LEDs. For example, the heat exchanger may be a thermoelectric cooling device. The heat exchanger may be encapsulated in an insulated cover, and several heat pipes may extend from respective LEDs mounted on the insulated cover, through the insulated cover to the heat exchanger.

In an embodiment, a method of desorbing molecules from a chamber wall surrounding a chamber volume includes irradiating the chamber wall by several LEDs of a desorption device. For example, the LEDs may emit UV radiation, e.g., UV C radiation, to uniformly irradiate the chamber wall. The method further includes reducing a chamber pressure of the chamber volume to a test pressure, e.g., a pressure less than or equal to $1 \times 10^{-4}$ Torr. The method further includes determining whether an externally administered test gas, e.g., helium, is present in the chamber volume when the chamber pressure is at the test pressure. Accordingly, leak testing of the process chamber may be performed quickly and effectively.

The above summary does not include an exhaustive list of all aspects. It is contemplated that all systems and methods are included that can be practiced from all suitable combinations of the various aspects summarized above, as well as those disclosed in the Detailed Description below and particularly pointed out in the claims filed with the application. Such combinations have particular advantages not specifically recited in the above summary.

DETAILED DESCRIPTION

Figure 1:
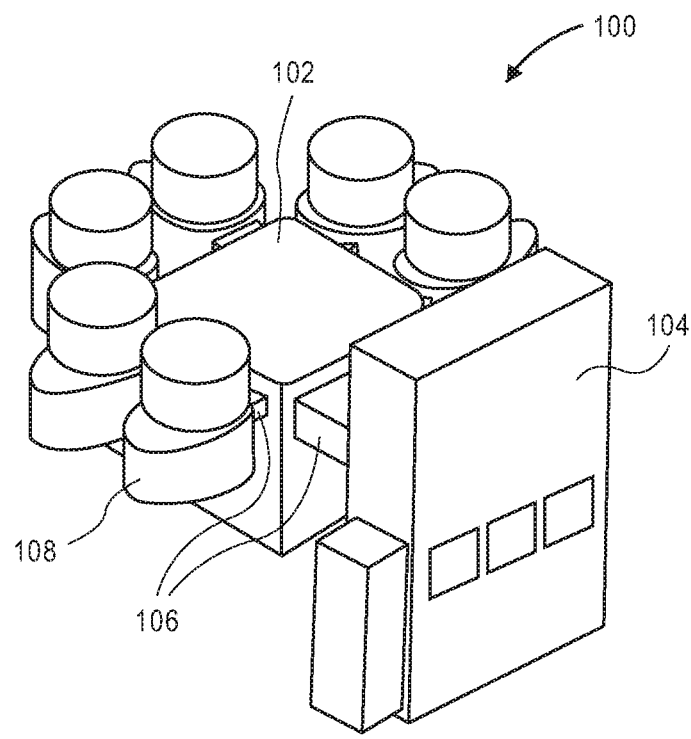
FIG. 1 is an illustration of a wafer processing tool, in accordance with an embodiment.

Devices and methods used for desorbing molecules from a chamber wall are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Leak testing of semiconductor equipment using a leak detector can be performed under a vacuum, e.g., in the $10^{-4}$ Torr range. Pumping down the chamber to the vacuum pressure, however, can require substantial periods of time. For example, an initial pump down time can be an hour. Furthermore, subsequent pump down times, i.e., after a vacuum has been broken and air has been allowed into the chamber, can be more than an hour. The lengthy pump down time is caused by water molecules absorbed in the chamber walls. Desorption of the water molecules to reach a test pressure requires lengthy exposure to vacuum.

Dedicated hot cathode mercury discharge tubes have been used to energize water vapor molecules within vacuum chambers. Such dedicated lamps, however, are not transferable between multiple chambers of a wafer processing tool, and furthermore, such dedicated lamps require specific modifications to the process chambers, e.g., pass-through flanges, to allow for an external power supply to energize the lamp.

In an aspect, a desorption device includes a substrate having a wafer form factor. The desorption device can be loaded into a semiconductor equipment vacuum chamber using operations typical of the semiconductor processes that the vacuum chamber is used to perform. More particularly, the desorption device can be transferred into any of several vacuum chambers in a wafer processing tool. The desorption device includes several light emitting diodes (LEDs) mounted on the substrate to direct radiation, e.g., ultraviolet (UV) radiation, toward a chamber wall of the vacuum chamber. The LEDs can be powered locally by a power source of the desorption device, and thus, no modification to the vacuum chamber or external power supply is required for the desorption device to function. The LEDs may uniformly irradiate the chamber wall such that water molecules are energized and desorbed from the chamber wall more quickly than under vacuum alone.

Accordingly, a requisite test pressure, e.g., in a range of $10^{-4}$ Torr or less, can be achieved within the vacuum chamber more quickly using the desorption device than is currently possible under vacuum alone. Thus, manufacturing quality testing of one or more vacuum chambers of a wafer processing tool can be performed effectively using the desorption device.

It will be understood that the desorption devices and methods described below could be used in any form factor or process where desorption of molecules from a chamber wall expedites pressure changes. More particularly, although the desorption devices and methods are described with respect to performing leak testing of process chambers used for the fabrication of integrated circuits, the devices and methods may also be adapted for use in other technologies, such as process chambers used for the fabrication of displays in the electronics industry and/or photovoltaic cells in the solar industry.

Referring to FIG. 1, a wafer processing tool is illustrated in accordance with an embodiment. A wafer processing tool 100 may include a buffer chamber 102 physically connected to a factory interface 104 by one or more load locks 106. Furthermore, one or more process chambers 108 may be physically connected to buffer chamber 102 by one or more respective load locks 106. Buffer chamber 102 may essentially act as an intermediate volume, larger than respective volumes of process chambers 108, that remains at a low pressure, albeit at a pressure higher than the process pressures within process chambers 108. Thus, a semiconductor wafer, e.g., a silicon wafer, may be moved between chambers of wafer processing tool 100 under vacuum conditions during the manufacture of semiconductor devices. This movement may be enabled by various devices included in the wafer processing tool 100, e.g., robotic arms, shuttles, etc.

Various manufacturing operations may be performed in processing chambers 108. For example, at least one of processing chambers 108 may be a plasma etch chamber, a deposition chamber, a chamber of a semiconductor lithography tool, or any other semiconductor process tool chamber. As such, process chamber 108 may be used to perform manufacturing processes under vacuum conditions. By way of example, manufacturing process may be performed under vacuum conditions in the $10^{-6}$ Torr range or lower, e.g., in the $10^{-8}$ Torr range.

The ability to maintain vacuum without ingress of the surrounding environment, i.e., without leaks, is critical to achieving a robust wafer manufacturing process. Leaks can happen, however, and are most likely to occur at certain locations such as O-ring seals, metal gaskets, shut-off valves, and chamber welds, in load lock 106 or process chamber 108.

In an embodiment, load lock 106 or process chamber 108 can be tested during fabrication of wafer processing tool 100 to detect the presence of leaks. By way of example, a leak detector can be connected to an internal chamber volume of process chamber 108 and all ports of process chamber 108, e.g., load lock 106, or a chamber door, can be sealed. A test gas, such as helium, may be applied externally around process chamber 108 at the locations where leaks are most likely to occur, and the leak detector can sense whether the test gas is detected within the sealed volume. If the test gas is detected, a leak is determined to be present.

As described above, leak testing can be performed with the process chamber 108 under a predetermined vacuum level, and achieving that vacuum level can be expedited by irradiating the chamber walls of process chamber 108 to desorb water vapor molecules. The water vapor molecules may have been absorbed, for example, by anodized chamber walls of process chamber 108 during a previous venting cycle of process chamber 108. In an embodiment, irradiation of process chamber 108 may be performed using a desorption device that is transferable throughout wafer processing tool 100, as described below.

Figure 2:
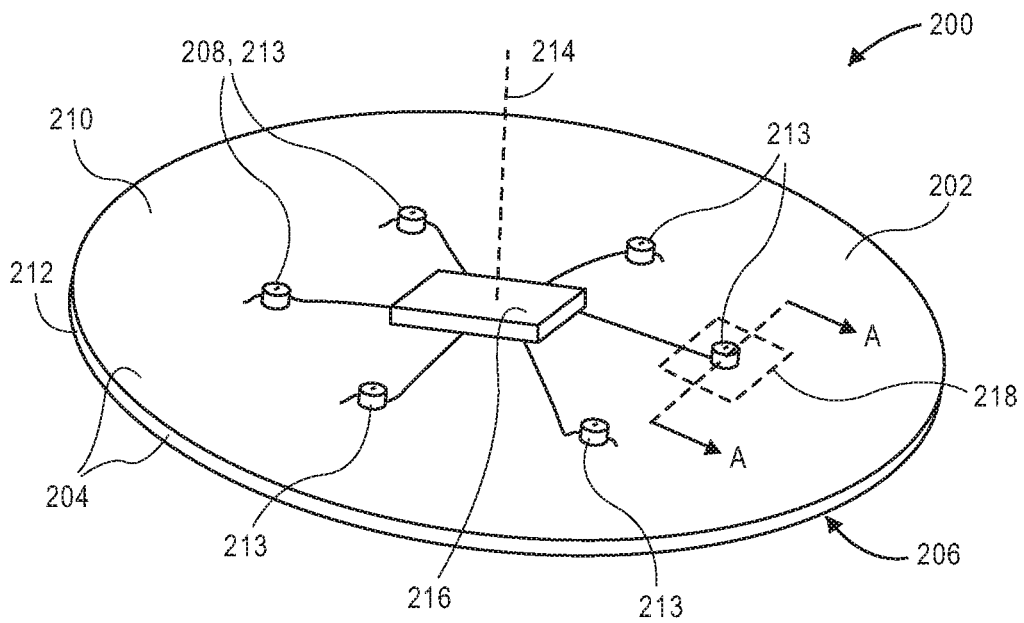
FIG. 2 is an illustration of a desorption device, in accordance with an embodiment.

Referring to FIG. 2, a desorption device is illustrated in accordance with an embodiment. A desorption device 200 for absorbing molecules from a chamber wall of process chamber 108 may include a substrate 202 having a wafer form factor. In an embodiment, the wafer form factor is essentially disc-shaped, and includes a support surface 204 having a diameter 206. More particularly, the size of substrate 202 may be the same as readily-available semiconductor wafer sizes. Accordingly, diameter 206 may be between 95 to 455 mm, e.g., nominally 100 mm, 300 mm, or 450 mm. Similarly, substrate 202 may include a thickness defining a wafer form factor. For example, the thickness may be less than 1 mm, e.g., 525 μm, 775 μm, or 925 μm. As described below, however, the thickness may be somewhat greater than a thickness typical of semiconductor wafers. For example, the thickness may be greater than 1 mm, e.g., 5-25 mm.

The wafer form factor of substrate 202 can allow desorption device 200 to be manufactured using readily available wafer materials and typical wafer manufacturing processes and equipment. For example, substrate 202 may be fabricated from a semiconductor material such as silicon. Accordingly, substrate 202 may essentially simulate a semiconductor wafer that is to be processed by wafer processing tool 100. Furthermore, the wafer form factor of substrate 202 allows desorption device 200 to be moved between chambers of wafer processing tool 100.

Substrate 202 may be fabricated from materials having low outgassing properties. Alternatively, substrate 202 may have a core layer surrounded by a coating layer, and the coating layer may have a lower outgassing property than the core layer. By way of example, a low outgassing material that may be suitable for the coating layer includes polyether ether ketone (PEEK). In an embodiment, substrate 202 and/or the core layer includes a metal, e.g., aluminum. Outgassing of the metal may be minimized through introduction into process chamber 108. Low outgassing may be beneficial for all components of desorption device 200, and thus, the low outgassing materials described above (and other low outgassing materials) may be incorporated in any of the components of desorption device 200, including the components described below.

Desorption device 200 may include one or more LEDs 208 mounted on support surface 204. Support surface 204 can be any surface of substrate 202. For example, support surface 204 may include a top surface 210, a lateral edge 212, or a bottom surface (not shown) of a disc-shaped substrate 202. Accordingly, one or more LEDs 208 may be mounted on top surface 210, lateral edge 212, or a bottom surface (hidden).

In an embodiment, a first set 213 of several LEDs 208 are mounted on top surface 210. The LEDs 208 may be symmetrically disposed about a central axis 214 extending orthogonal to top surface 210. For example, each LED 208 of the first set 213 may be located at a fixed radius from central axis 214, and an arc angle between radial lines passing through adjacent LEDs 208 may be the same. That is, in the case of the first set 213 having six LEDs 208, each LED 208 may be separated from an adjacent LED 208 by an arc angle of 60 degrees.

The LEDs 208 of desorption device 200 may emit UV radiation when electrically powered. For example, desorption device 200 may include a power source 216 mounted on substrate 202, and power source 216 may be electrically coupled to LEDs 208 on substrate 202 to electrically power LEDs 208. Power source 216 may include a battery, e.g., a rechargeable battery. Characteristics of LEDs 208 and power source 216 are described in further detail with respect to FIG. 8 below.

LEDs 208 may generate substantial heat when irradiating chamber walls of process chamber 108. Accordingly, to maintain LEDs 208 within an operational temperature range, desorption device 200 may include a heat exchanger 218, represented by a dashed line, thermally coupled to at least one of the LEDs 208.

Figure 3:
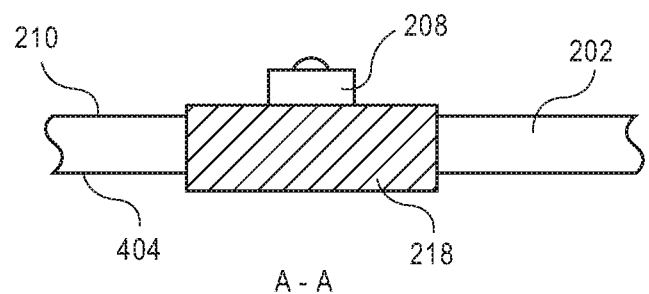
FIG. 3 is a cross-sectional illustration, taken about line A-A of FIG. 2, of a light emitting diode (LED) thermally coupled to a heat exchanger of a desorption device, in accordance with an embodiment.

Referring to FIG. 3, a cross-sectional illustration, taken about line A-A of FIG. 2, of a light emitting diode (LED) thermally coupled to a heat exchanger of a desorption device is shown in accordance with an embodiment. Heat exchanger 218 may be mounted on and/or within substrate 202. More particularly, at least a portion of heat exchanger 218 may extend above top surface 210 and/or below a bottom surface 404 of substrate 202. In an embodiment, heat exchanger 218 may be a passive heat sink. Alternatively, heat exchanger 218 may be an active heat sink, i.e., a cooling device. For example, heat exchanger 218 may include a thermoelectric cooling device, such as a Peltier device. Accordingly, one or more LEDs 208 may be mounted on a hot-side of heat exchanger 218. A cold-side of heat exchanger 218 may include one or more fins, as in a passive heat sink, or may otherwise dissipate heat as described below.

It will be appreciated that, when desorption device 200 incorporates an active heat exchanger 218, heat exchanger 218 may be powered by an onboard power supply. For example, power source 216 may be electrically connected to heat exchanger 218 to control a thermoelectric cooling process of heat exchanger 218.

Figure 4:
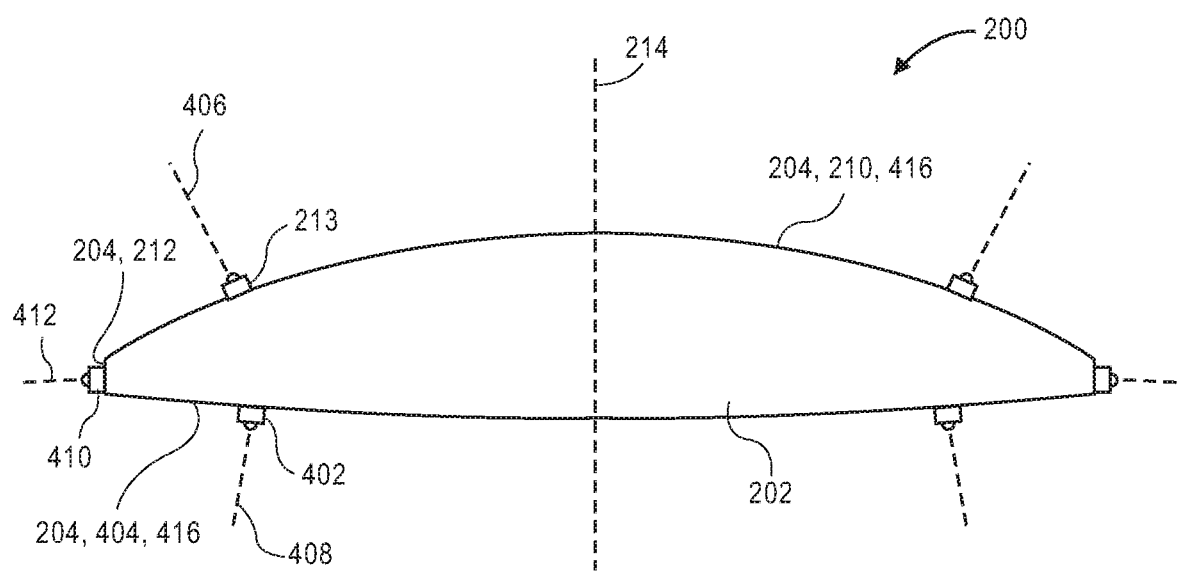
FIG. 4 is an illustration of a desorption device, in accordance with an embodiment.

Referring to FIG. 4, a desorption device is illustrated in accordance with an embodiment. Desorption device 200 may be configured to irradiate the chamber walls of process chamber 108. More particularly, LEDs 208 may be disposed on support surface 204 such that the emitted radiation from LEDs 208 impinges on all exposed surface area of the chamber walls. In an embodiment, LEDs 208 may be surface-mounted on all support surfaces 204 of desorption device 200. For example, first set 213 of LEDs 208 may be mounted on top surface 210, as described above. Furthermore, a second set 402 of LEDs 208 may be mounted on bottom surface 404 of substrate 202 to direct radiation in an opposite direction from the radiation emitted by first set 213. That is, first set 213 may emit radiation in a first radiant direction 406 upward away from top surface 210, and second set 402 may emit radiation in a second radiant direction 408 downward away from bottom surface 404. Accordingly, first set 213 may irradiate an upper region of the chamber walls above a lateral plane passing through substrate 202 orthogonal to central axis 214, and second set 402 may irradiate a lower region of the chamber walls below the lateral plane.

To avoid blind spots on the chamber walls, i.e., regions between the upper region irradiated by first set 213 and the lower region irradiated by second set 402, desorption device 200 may include a third set 410 of LEDs 208 mounted on lateral edge 212 of substrate 202. A thickness of substrate 202 at lateral edge 212 may be larger than a typical semiconductor wafer form factor to provide ample area to surface-mount LEDs 208 on lateral edge 212. For example, the thickness of substrate 202 at lateral edge 212 may be in a range of 0.25-1.0 inch. Third set 410 may emit radiation in a third radiant direction 412 in a transverse direction relative to central axis 214, away from lateral edge 212. Accordingly, third set 410 may irradiate a lateral region of the chamber walls around substrate 202. The lateral region, for example, may include a portion of the chamber walls that is intersected by the lateral plane passing through substrate 202, and may be between the upper and lower regions of the chamber walls.

Placement of at least one LED 208 on all support surfaces 204 of substrate 202 may cause all chamber walls of process chamber 108 to be exposed to UV rays. In addition to irradiating the chamber walls, however, desorption device 200 may be configured to uniformly irradiate the chamber walls. That is, the LEDs 208 may be arranged in a configuration such that all inner surfaces of process chamber 108 are exposed to UV rays emitted by LEDs 208 of desorption device 200. For example, one or more of support surfaces 204 may be a curved surface 416. Still referring to FIG. 4, top surface 210 and bottom surface 404 are illustrated as being curved surfaces 416. A radius of curvature of curved surfaces 416 can affect a directionality of the emitted UV radiation. For example, top surface 210 may have a concave upward surface having a first radius measured from a first point along central axis 214. By contrast, bottom surface 404 may have a concave downward surface having a second radius measured from a second point along central axis 214 above the first point. The first radius may be less than the second radius such that the curvature of top surface 210 is more pronounced than the curvature of bottom surface 404. Accordingly, an angle formed between first radiant direction 406 and central axis 214 may be greater than an angle formed between second radiant direction 408 and central axis 214. That is, first radiant direction 406 may have a greater lateral component than second radiant direction 408. As such, the curvatures of support surfaces 204 may be tuned according to an expected placement of desorption device 200 within process chamber 108 to optimize a uniformity of irradiation of the chamber walls.

Figure 5:
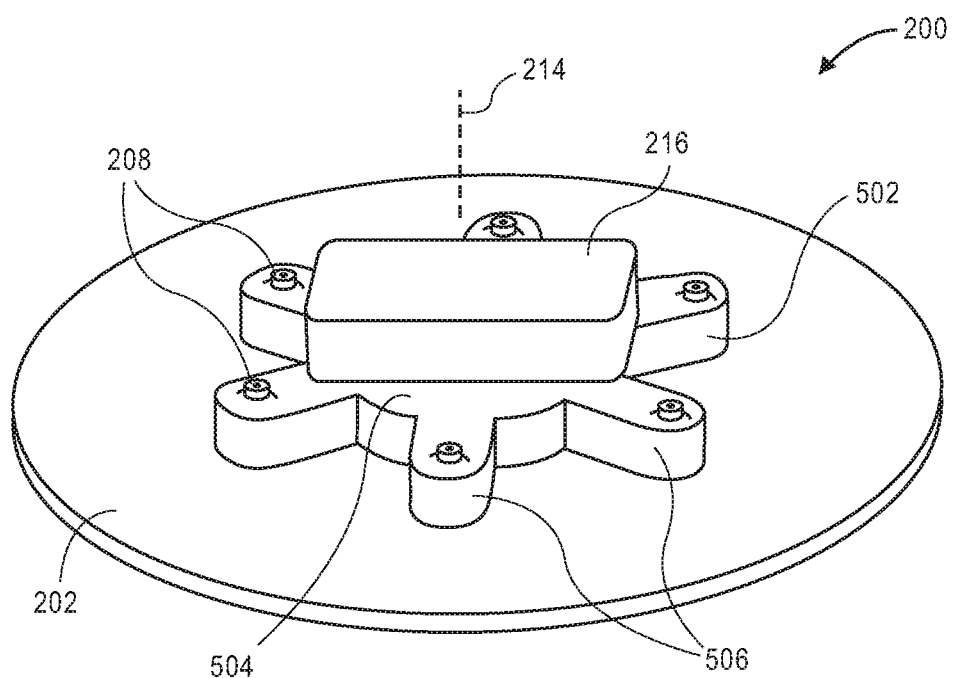
FIG. 5 is an illustration of a desorption device, in accordance with an embodiment.
Figure 7:
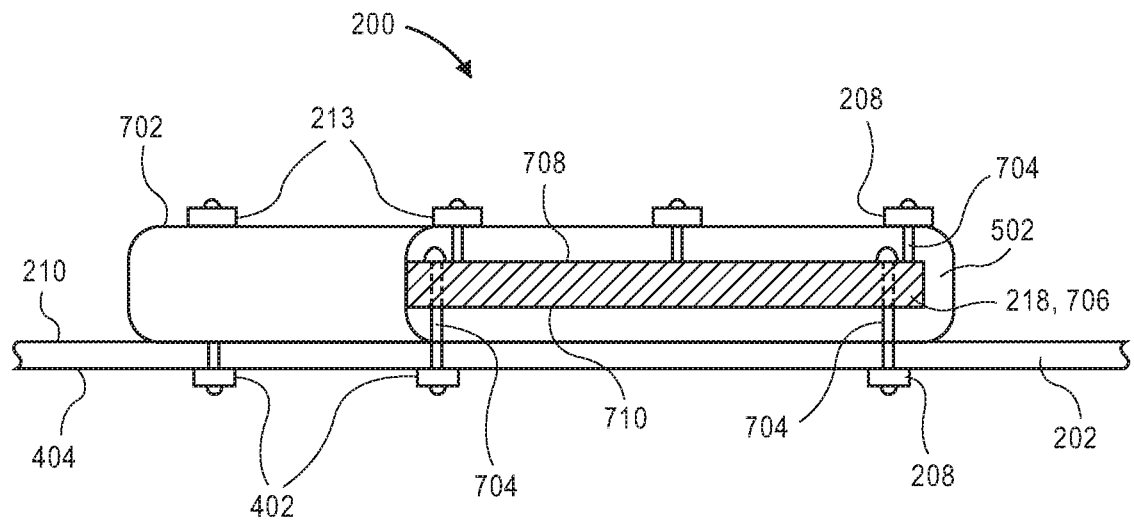
FIG. 7 is a partial cross-sectional illustration of a desorption device, in accordance with an embodiment.

Referring to FIG. 5, a desorption device is illustrated in accordance with an embodiment. Desorption device 200 may include an insulated cover 502 to surround at least a portion of heat exchanger 218. For example, heat exchanger 218 may be encapsulated in insulated cover 502 (FIG. 7). The encapsulated heat exchanger 218 may be mounted on substrate 202 as described above. Furthermore, power source 216 may be mounted on insulated cover 502. Accordingly, electrical connections between power source 216 and LEDs 208 or heat exchanger 218 may be routed through insulated cover 502.

Insulated cover 502 may be formed from a dielectric material, such as an epoxy or a polymer. The dielectric material may be molded into a predetermined shape. For example, the dielectric material may be formed into insulated cover 502 having a circular central section 504 and several cover arms 506 radiating from the central section 504 laterally outward from central axis 214. Heat exchanger 218 may be encapsulated within central section 504 and LEDs 208 may be surface mounted on cover arms 506.

Figure 6:
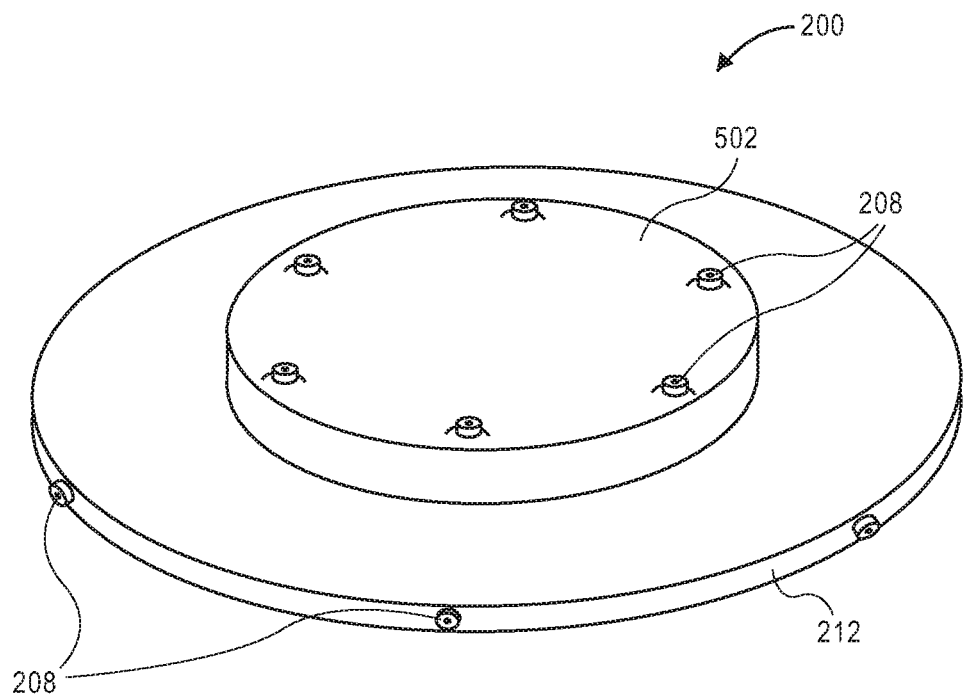
FIG. 6 is an illustration of a desorption device, in accordance with an embodiment.

Referring to FIG. 6, a desorption device is illustrated in accordance with an embodiment. Insulated cover 502 may have a circular profile. More particularly, insulated cover 502 may be disc-shaped. Accordingly, insulated cover 502 may encapsulate one or both of heat exchanger 218 or power source 216. Furthermore, LEDs 208 may be mounted on a surface of insulated cover 502 to direct UV radiation outward toward the chamber walls of process chamber 108. LEDs 208 may also be mounted on lateral edge 212, as described above, to direct UV radiation laterally outward from desorption device 200.

Referring to FIG. 7, a partial cross-sectional illustration of a desorption device is illustrated in accordance with an embodiment. First set 213 of LEDs 208 may be mounted on an upper surface 702 of insulated cover 502 above top surface 210 of substrate 202. Second set 402 of LEDs 208 may be mounted on bottom surface 404 of substrate 202, on an opposite side of substrate 202 from insulated cover 502.

In an embodiment, heat generated by LEDs 208 may be transferred to heat exchanger 218 by respective heat pipes 704. For example, heat exchanger 218 may be a thermoelectric cooling device 706 having a hot-side 708 and a cold-side 710. Thermoelectric cooling device 706 may be encapsulated in insulated cover 502. Accordingly, heat exchanger 218 may be mounted on substrate 202, given that heat exchanger 218 is encapsulated within insulated cover 502, and insulated cover 502 is mounted on substrate 202.

Thermoelectric cooling device 706 is provided as an example of an active heat exchanger 218, and other active heat exchanger types may be used for heat exchanger 218. For example, heat exchanger 218 may include a Phase Change Material (PCM) heat sink. A PCM heat sink can absorb thermal energy with minimal temperature rise during a solid to liquid phase transition. A PCM may be contained in a hermetically sealed enclosure, e.g., insulated cover 502, and used to maintain the temperature of LEDs 208 during a leak test procedure. A PCM heat sink may include a PCM that maintains LEDs below an LED operating temperature. For example, PCM may include a paraffin wax.

One or more heat pipes 704 may extend from each LED 208 to thermoelectric cooling device 706 through the dielectric material of insulated cover 502. A single heat pipe 704 may also extend from several LEDs 208 to thermoelectric cooling device 706 through insulated cover 502. That is, one or more heat pipes 704 may be thermally coupled to one or more LEDs 208. Each heat pipe 704 may be a conductive material, such as copper or aluminum, formed as a channel to efficiently conduct heat from LEDs 208 to hot-side 708. For example, heat pipe 704 may include a wire having a first end coupled to LED 208 of second set 402, and a second end coupled to hot-side 708. Accordingly, the wire may be formed to follow a path upward from a location below heat exchanger 218, around heat exchanger 218 to a location on hot-side 708 above heat exchanger 218.

Thermoelectric cooling device 706 may be a Peltier device to transfer heat from hot-side 708 to cold-side 710 using the Peltier effect. When heat is transferred to cold-side 710, it may disperse within insulated cover 502, causing insulated cover 502 to act as a heat sink. By retaining heat within insulated cover 502, a temperature within the evacuated process chamber 108 may remain constant. Thus, the ability to achieve a predetermined test pressure within process chamber 108 may be unaffected by temperature changes within process chamber 108.

It will be appreciated that heat exchanger 218 may be a passive heat sink, such as a monolithic mass of a conductive material, e.g., aluminum. In such case, heat pipes 704 may extend from LEDs 208 to heat exchanger 218 to transfer heat directly from the radiating light sources to the passive heat sink within insulated cover 502.

Figure 8:
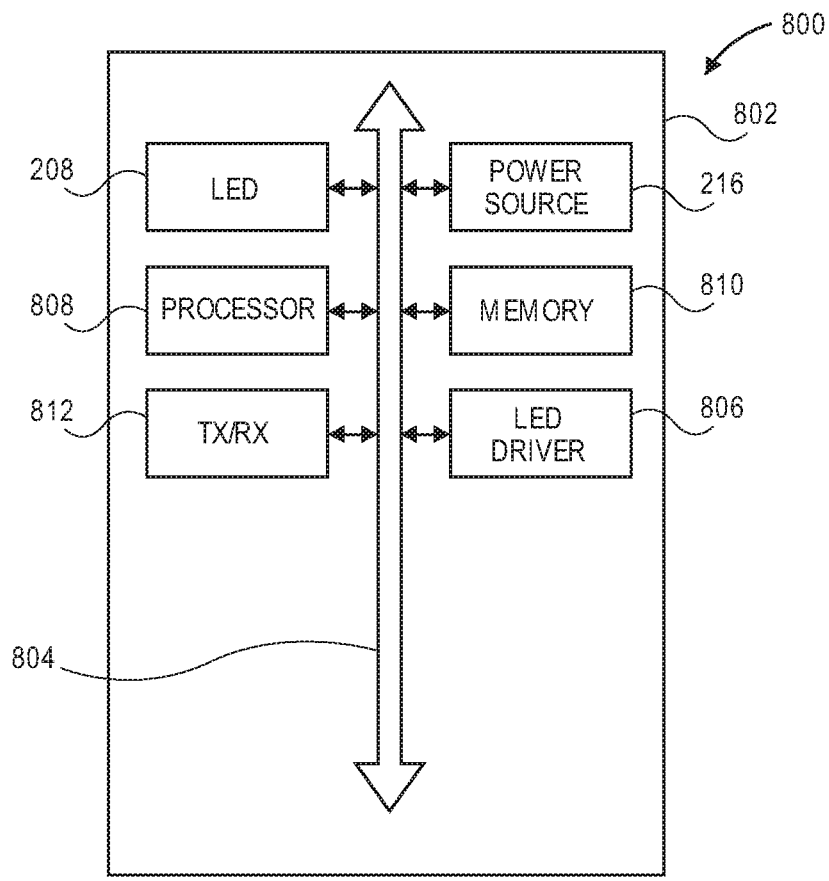
FIG. 8 is a block diagram of electronic circuitry of a desorption device, in accordance with an embodiment.

Referring to FIG. 8, a block diagram of electronic circuitry of a desorption device is illustrated in accordance with an embodiment. Electronic circuitry 800 of desorption device 200 may be enclosed or supported in a housing 802, or may be exposed to process chamber 108. Housing 802 and/or electronic components of electronic circuitry 800 may be mounted on support surface 204 of substrate 202. Electronic circuitry 800 may be electrically interconnected through an electrical bus 804, electrical trace, electrical lead, or via, routed over or through substrate 202. Accordingly, components of electronic circuitry 800 may be on a same or opposite side of substrate 202.

Electronic circuitry 800 of desorption device 200 may include LEDs 208 mounted on substrate 202. As described above, LEDs 208 may emit UV radiation when electrically powered by power source 216. In an embodiment, at least a portion of the UV radiation is in the UV C range. For example, LEDs 208 may be configured to emit UV radiation having a wavelength between 100 to 280 nm. More particularly, LEDs 208 may be configured to emit UV radiation having a wavelength of 255 nm or less. In an embodiment, at least 10% of the UV radiation emitted by LEDs 208 has a wavelength of 190+/−10 nm. Power output of each LED 208 may vary based on current draw. For example, each LED 208 may output 4-6 mW at a constant current of 100 mA, or 12-18 mW at a constant current of 300 mA.

Electronic circuitry 800 of desorption device 200 may include power source 216 mounted on substrate 202. Power source 216 may include a battery, a capacitor bank, or another known power supply. Power source 216 may be electrically connected to one or more of the components of desorption device 200 through bus 804, to power the connected components. For example, power source 216 may be electrically connected to one or more of LEDs 208, a processor 808, or a memory 810. Power source 216 may be lightweight. By way of example, power source 216 may include a rechargeable lithium-ion battery. Accordingly, power source 216 may be readily mounted on substrate 202. Furthermore, power source 216 may be adapted to provide electrical power having one or more of a constant electrical current or a constant electrical voltage. For example, power source 216 may supply a constant electrical current of 100 mA or 300 mA to each LED 208. Electrical power supplied to LEDs 208 may be adjusted to provide sufficient power to irradiate chamber surface areas of various sizes, irradiance power may positively correlate with chamber volume. For example, LEDs 208 may be controlled to output higher irradiance when desorption device 200 is located within process chamber 108 as compared to when desorption device 200 is located within load lock 106. Electrical power from power source 216 may be controlled by one or more external components, e.g., a switch, an LED driver 806, etc., to provide regulated voltage direct current to the LEDs 208. Such external components may include or be separately controlled by the operation of logic circuits, such as by a feedback circuit to regulate output voltage.

Electronic circuitry 800 of desorption device 200 may include a processor 808. Processor 808 may be operably coupled, e.g., electrically connected by bus 804 and/or traces, to power source 216, LEDs 208, and/or components used to control power source 216 and LEDs 208. Processor 808 represents one or more general-purpose processing devices such as a microprocessor, central processing unit, or the like. More particularly, processor 808 may be a complex instruction set computing (CISC) microprocessor, reduced instruction set computing (RISC) microprocessor, very long instruction word (VLIW) microprocessor, a processor implementing other instruction sets, or processors implementing a combination of instruction sets. Processor 808 may also be one or more special-purpose processing devices such as an application specific integrated circuit (ASIC), a field programmable gate array (FPGA), a digital signal processor (DSP), network processor, or the like.

Processor 808 is configured to execute processing logic for performing the operations described herein. For example, processor 808 may control a feedback circuit to regulate electrical voltage or electrical current output from power source 216 such that LEDs 208 are adequately powered to generate UV radiation having a predetermined wavelength, e.g., UV C rays.

Electronic circuitry 800 of desorption device 200 may include a memory 810 mounted on substrate 202. Memory 810 may include one or more of a main memory (e.g., read-only memory (ROM), flash memory, dynamic random access memory (DRAM) such as synchronous DRAM (SDRAM) or Rambus DRAM (RDRAM), etc.), a static memory (e.g., flash memory, static random access memory (SRAM), etc.), or a secondary memory (e.g., a data storage device). Processor 808 may communicate with memory 810 via bus 804 or other electrical connection. Thus, processor 808 may be operably coupled to memory 810 to retrieve instructions for execution to cause desorption device 200 to perform the operations described herein.

As described above, electronic circuitry 800 may include components, such as LED driver 806, to control LED 208 output. In an embodiment, electronic circuitry 800 includes electronic components to allow for desorption device 200 to be remotely actuated. For example, electronic circuitry 800 may include one or more transmitter, receiver, and/or transceiver 812 placed in electrical communication with processor 808 or LED driver 806, and remotely operable by corresponding circuitry controlled by a user external to processing tool. Accordingly, the user may remotely actuate LEDs 208 to start and stop irradiation of process chamber 108, without the need to open and close process chamber 108 to control desorption device 200.

Figure 9:
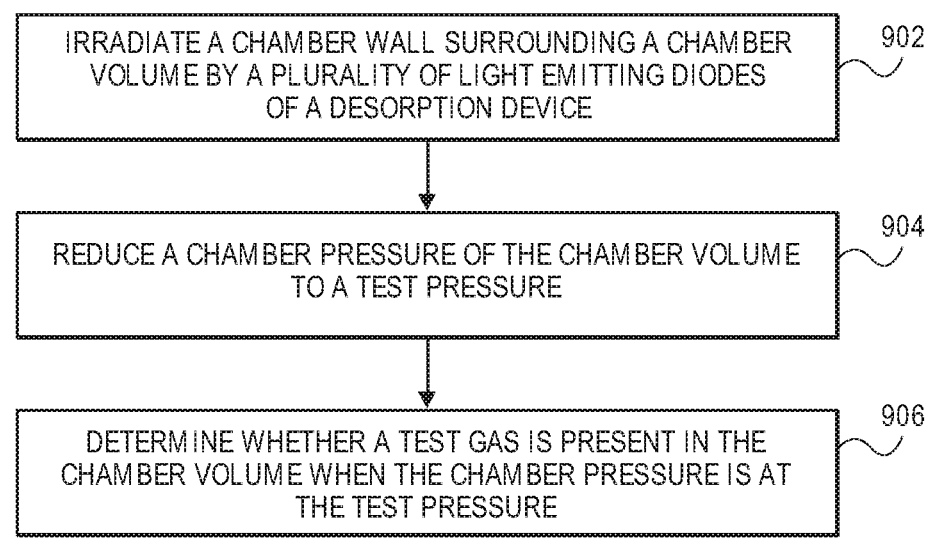
FIG. 9 is an illustration of a flowchart representing operations in a method of desorbing molecules from a chamber wall, in accordance with an embodiment.
Figure 10A:
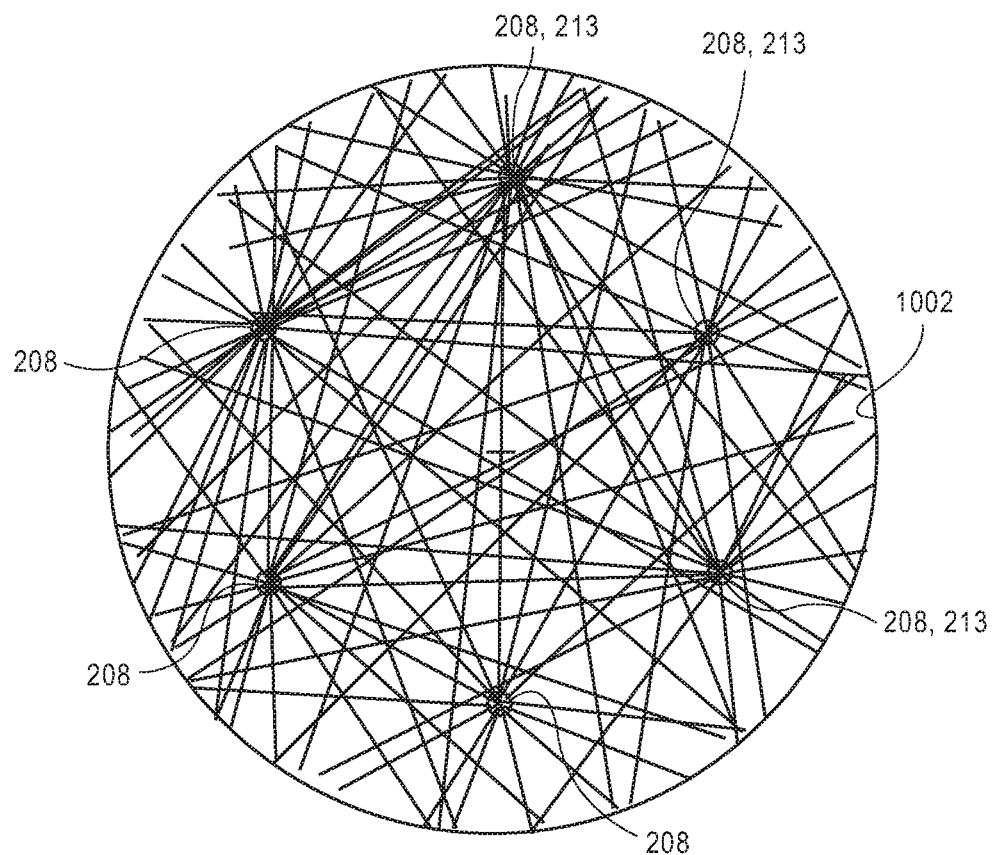
FIGS. 10A-10B illustrate operations in a method of desorbing molecules from a chamber wall, in accordance with an embodiment.
Figure 10B:
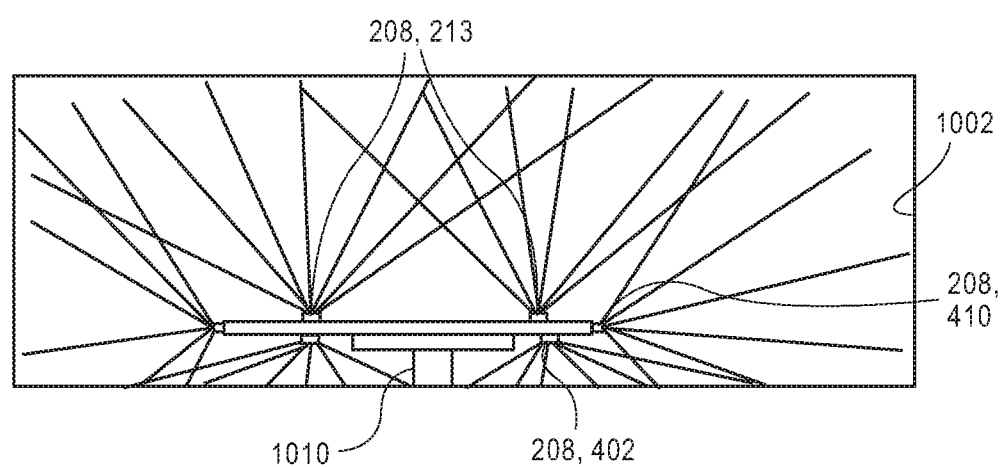

Referring to FIG. 9, a flowchart representing operations in a method of desorbing molecules from a chamber wall is illustrated in accordance with an embodiment. FIGS. 10A-10B illustrate operations in the charted method of FIG. 9, and thus, FIGS. 9-10B are described in combination below.

Desorption device 200 has a geometric shape resembling a traditional semiconductor wafer, and can therefore be loaded into wafer processing tool 100 and/or process chamber 108. In an embodiment, bottom surface 404 of desorption device 200 can be mounted on an electrostatic chuck 1010 within process chamber 108. Accordingly, desorption device 200 can be manually or automatically transferred into process chamber 108, and process chamber 108 may be sealed for leak testing.

At operation 902, desorption device 200 may be actuated to irradiate process chamber 108. Actuation of desorption device 200 may be performed remotely to turn on LEDs 208. Referring to FIG. 10A, six LEDs 208 arranged symmetrically about central axis 214 are shown irradiating a chamber wall 1002 of process chamber 108. Chamber wall 1002 surrounds a chamber volume within which wafer manufacturing processes are performed. As shown, UV radiation emitted by LEDs 208 may irradiate chamber wall 1002 uniformly. More particularly, referring to FIG. 10B, UV radiation emitted by LEDs 208 of first set 213, second set 402, and third set 410, may overlap such that all areas of chamber wall 1002 receive UV radiation.

At operation 904, a chamber pressure of the chamber volume may be reduced to a test pressure. A rough pump in fluid communication with the chamber volume may begin evacuating the chamber volume before or after LEDs 208 are actuated. For example, LEDs 208 may be turned on via a remote connection before or after the rough pump has started. Evacuation of the chamber volume may continue until the test pressure is reached. For example, the test pressure may be equal to or less than $1 \times 10^{-4}$ Torr. More particularly, the test pressure may be a level at which a leak detector in fluid communication with the chamber volume is most efficiently operated.

In an embodiment, LEDs 208 are actuated for a predetermined amount of time. Alternatively, LEDs 208 may remain on, i.e., irradiation of the chamber walls 1002 may occur, until the test pressure is reached. When the test pressure is reached, the LEDs 208 may be turned off via the remote connection. Similarly, LEDs 208 may be turned off when the predetermined amount of time has expired.

At operation 906, a determination may be made as to whether a test gas is present in the chamber volume. For example, a leak detector may be used when the chamber pressure is at the test pressure to detect whether the test gas, e.g., helium, has infiltrated the chamber volume from an external location. By way of example, helium may be applied to an outer surface of a gasket or an O-ring of process chamber 108, and if a leak in the tested seal is present, the helium will be sucked into the chamber volume toward the leak detector. When the leak detector senses the test gas, the leak can be detected and communicated to the user. Accordingly, appropriate manufacturing rework operations may be undertaken to repair process chamber 108.

In an embodiment, a mass spectrometer may be integrated into desorption device 200. More particularly, desorption device 200 may include an onboard mass spectrometer (not shown) as a component. The onboard mass spectrometer may be mounted on support surface 204. The mass spectrometer may be electrically connected with any other component of electronic circuitry 800 through bus 804. For example, the onboard mass spectrometer may be powered by power source 216, and may provide electrical signals corresponding to sensed molecules to processor 808. Furthermore, electronic circuitry 800 may include additional components not shown in FIG. 8 to communicate data generated by desorption device 200 to a remote computer. For example, processor 808 may control a wireless transmitter to transmit data corresponding to detected test gases to an external device to signal to a user that a leak is present. Accordingly, desorption device 200 may include an onboard mass spectrometer.

Desorption device 200 may provide faster pump down times of process chamber 108 than can be achieved using the rough pump alone. For example, it has been determined that irradiation device can reduce the pump down time by at least 50% as compared to evacuating process chamber 108 using the rough pump alone. Accordingly, evacuation of process chamber 108 under irradiation from LEDs 208 of desorption device 200 may be used for faster leak testing of all types of process chambers.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A desorption device, comprising:
   a substrate having a disc-shaped wafer form factor, wherein the substrate includes a flat support surface and a flat bottom surface opposite the flat support surface, and wherein the disc-shaped wafer form factor has a diameter greater than a thickness between the flat support surface and the flat bottom surface;
   a plurality of light emitting diodes (LEDs) mounted on the flat support surface, wherein the plurality of LEDs emit ultraviolet (UV) radiation when electrically powered;
   a power source mounted on the flat support surface of the substrate, wherein the power source is electrically coupled to the plurality of LEDs to electrically power the plurality of LEDs; and
   a heat exchanger thermally coupled to at least one of the plurality of LEDs.

2. The desorption device of claim 1, wherein the UV radiation is in a UV C range.

3. The desorption device of claim 2, wherein the plurality of LEDs include a first set of LEDs mounted symmetrically about a central axis extending orthogonal to the flat support surface of the substrate.

4. The desorption device of claim 3, wherein the plurality of LEDs include a second set of LEDs mounted on the flat bottom surface of the substrate.

5. The desorption device of claim 3, wherein the plurality of LEDs include a third set of LEDs mounted on a lateral edge of the substrate.

6. The desorption device of claim 2, wherein the heat exchanger is encapsulated in an insulated cover, and further comprising a plurality of heat pipes extending from respective LEDs through the insulated cover to the heat exchanger.

7. The desorption device of claim 6, wherein the heat exchanger includes a thermoelectric cooling device.

8. The desorption device of claim 2, wherein the substrate includes a semiconductor material.

9. The desorption device of claim 8, wherein the wafer form factor includes a diameter between 95 to 455 mm.

10. A desorption device, comprising:
    a substrate having a disc-shaped wafer form factor, wherein the substrate includes a flat support surface and a flat bottom surface opposite the flat support surface, and wherein the disc-shaped wafer form factor has a diameter greater than a thickness between the flat support surface and the flat bottom surface;
    a heat exchanger mounted on the substrate, wherein the heat exchanger includes a thermoelectric cooling device encapsulated in an insulated cover;
    a light emitting diode (LED) thermally coupled to the heat exchanger, wherein the LED emits ultraviolet (UV) radiation when electrically powered, the LED mounted on the flat support surface of the substrate; and
    a power source mounted on flat support surface of the substrate.

11. The desorption device of claim 10, wherein the UV radiation is in a UV C range.

12. The desorption device of claim 11 further comprising one or more heat pipes extending from the LED to the thermoelectric cooling device through the insulated cover.

13. The desorption device of claim 11, wherein the power source is electrically coupled to the LED and the thermoelectric cooling device to electrically power the LED and the thermoelectric cooling device.

14. The desorption device of claim 12, wherein the power source is electrically coupled to the thermoelectric cooling device to electrically power the thermoelectric cooling device.

15. A method comprising:
    irradiating a chamber wall surrounding a chamber volume by a plurality of light emitting diodes (LEDs) of a desorption device, wherein the device includes a substrate having a flat support surface and a flat bottom surface opposite the flat support surface, the substrate having a disc-shaped wafer form factor, wherein the LEDs and a power source coupled to the LEDs are mounted on the flat support surface, wherein the disc-shaped wafer form factor has a diameter greater than a thickness between the flat support surface and the flat bottom surface, and wherein the LEDs emit ultraviolet (UV) radiation;
    reducing a chamber pressure of the chamber volume to a test pressure; and
    determining whether a test gas is present in the chamber volume when the chamber pressure is at the test pressure.

16. The method of claim 15, wherein the UV radiation is in a UV C range.

17. The method of claim 16, wherein the test pressure is equal to or less than $1 \times 10^{-4}$ Torr.

18. The method of claim 17, wherein the LEDs irradiate the chamber wall uniformly.

* * * * *